United States Patent
Kubinec

[11] Patent Number: 6,084,933
[45] Date of Patent: Jul. 4, 2000

[54] CHIP OPERATING CONDITIONS COMPENSATED CLOCK GENERATION

[75] Inventor: James Kubinec, Reno, Nev.

[73] Assignee: Advanced Micro Devices, Inc., Sunnyvale, Calif.

[21] Appl. No.: 08/971,574

[22] Filed: Nov. 17, 1997

[51] Int. Cl.⁷ .............. H04L 7/04; H03D 3/24; G06F 1/04; H03K 3/00

[52] U.S. Cl. .......... 375/362; 375/373; 375/376; 327/291; 327/298; 327/113; 327/114; 327/144; 327/153; 327/161; 327/162

[58] Field of Search ............... 375/362, 373, 375/374, 375, 376; 327/113, 114, 141, 144, 153, 161, 162, 291, 298

[56] References Cited

U.S. PATENT DOCUMENTS

| | | | |
|---|---|---|---|
| 4,494,021 | 1/1985 | Bell et al. | 327/262 |
| 4,789,996 | 12/1988 | Butcher | 375/376 |
| 4,988,960 | 1/1991 | Tomisawa | 332/127 |
| 5,132,572 | 7/1992 | Woo . | |
| 5,220,216 | 6/1993 | Woo . | |
| 5,227,679 | 7/1993 | Woo . | |
| 5,264,745 | 11/1993 | Woo . | |
| 5,349,612 | 9/1994 | Guo et al. . | |
| 5,363,419 | 11/1994 | Ho . | |
| 5,367,542 | 11/1994 | Guo . | |
| 5,371,425 | 12/1994 | Rogers | 327/3 |
| 5,374,904 | 12/1994 | Ishibashi | 331/17 |
| 5,400,370 | 3/1995 | Guo . | |
| 5,451,894 | 9/1995 | Guo . | |
| 5,452,333 | 9/1995 | Guo et al. . | |
| 5,457,336 | 10/1995 | Fang et al. . | |
| 5,457,719 | 10/1995 | Guo et al. . | |
| 5,479,129 | 12/1995 | Fernandez et al. | 327/276 |
| 5,550,514 | 8/1996 | Liedberg | 331/1 A |
| 5,852,616 | 12/1998 | Kubinec | 371/21.1 |
| 5,864,572 | 1/1999 | Bhagwan | 371/62 |

*Primary Examiner*—Stephen Chin
*Assistant Examiner*—Michael W. Maddox

[57] ABSTRACT

A clock generating system used to generate a clock signal which compensates for chip operating conditions. The system includes a delay line oscillator and a reference clock which determines the actual propagation time of delay elements on the chip. A clock generator which includes a number of serially connected delay units uses this information to generate a clock signal for the chip logic functions. The output clock rums the chip logic functions at the proper frequency for the current chip conditions.

11 Claims, 4 Drawing Sheets

6,084,933

CHIP OPERATING CONDITIONS COMPENSATED CLOCK GENERATION

FIELD OF THE INVENTION

This invention relates to clock generation and more particularly to generating a clock signal which compensates for variations in chip operating conditions.

BACKGROUND OF THE INVENTION

In an integrated circuit chip, the various functions performed by the logic elements and other components on the chip are synchronized by a chip clock signal. The clock signal controls the rate of logic operations performed on the chip and is crucial to the overall operation of the chip.

In prior art implementations, an external clock is supplied to the chip and the logic functions are expected to work correctly at the rate of the supplied clock. However, the individual logic elements located on the chip are dependent on chip temperature, chip operating voltage and process variables such as channel conductance and threshold voltage. Therefore, if the clock rate does not compensate for the variations in chip operating conditions, the chip may not be able to perform properly at the chip clock rate.

For example, assume a microprocessor chip is designed to function at 100 MHz at optimum operating conditions. If the chip is subjected to increased temperature conditions, the rate at which the individual logic elements on the chip perform can be expected to slow down. If the clock remains at 100 MHz, the logic functions will not be able to perform at this clock rate and the chip may output erroneous results or fail to perform.

Therefore, in prior art implementations, the chip logic functions must be designed for the worst case conditions of environmental variables (temperature, voltages, etc.). However, in practice, the variables are rarely all at the worst case conditions at the same time. Therefore, the chip logic is often operating at a clock rate below its optimum.

In other prior art implementations using conventional phase locked loop (PLL) or other mixed analog-digital approaches, the analog nature of the clock control signal makes the operation very sensitive to noise. Performance optimization becomes difficult especially when integration with very large scale high speed digital functions is necessary, since digital switching operations tend to induce a large amount of switching noise.

In view of the above, a need exists for providing a chip clock that supplies an accurate clocking signal to the chip logic functions, but also compensates for variations in the operating conditions on the chip itself. It additionally is desirable to provide a clock signal using a digital design which can be continuously updated based on the current chip conditions to enable the chip to operate at maximum efficiency.

SUMMARY OF THE INVENTION

A primary object of the invention is to optimize chip performance at different ambient operating conditions.

Another object of the invention is to compensate for current chip conditions by generating an accurate clocking signal that can be integrated into a digital design.

To achieve the foregoing and other objects and advantages, the present invention utilizes an oscillator circuit and a reference clock. The oscillator circuit is located on the chip and generates a signal having a nominal frequency which is chosen to equal the nominal frequency of the reference clock. The reference clock is located off the chip and outputs a stable clock signal. A comparator compares the frequencies of the oscillator and the reference clock and outputs a signal indicating the difference in frequency. A clock generator connected to the comparator generates a clock signal based on the output from the comparator. The clock generator preferably comprises a number of serially connected delay cells. The output of the clock generator provides an accurate clocking signal to the logic functions located on the chip based on the current chip conditions.

In accordance with one aspect of the invention, each delay cell comprises a pair of serially connected inverters.

In accordance with another aspect, the oscillator circuit also comprises a number of serially connected delay cells, with each delay cell comprising a pair of serially connected inverters. These delay cells exhibit the same characteristics as the delay cells of the clock generator since they are located on the same silicon substrate.

In another aspect of the invention, the number of serially connected delay cells in the oscillator circuit is based upon the propagation delay time of the delay cells under standard operating conditions and the oscillation frequency of the reference clock.

Other objects and advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings and description are to be regarded as illustrative in nature, and not as restrictive.

DETAILED DESCRIPTION OF THE INVENTION

Figure 1:
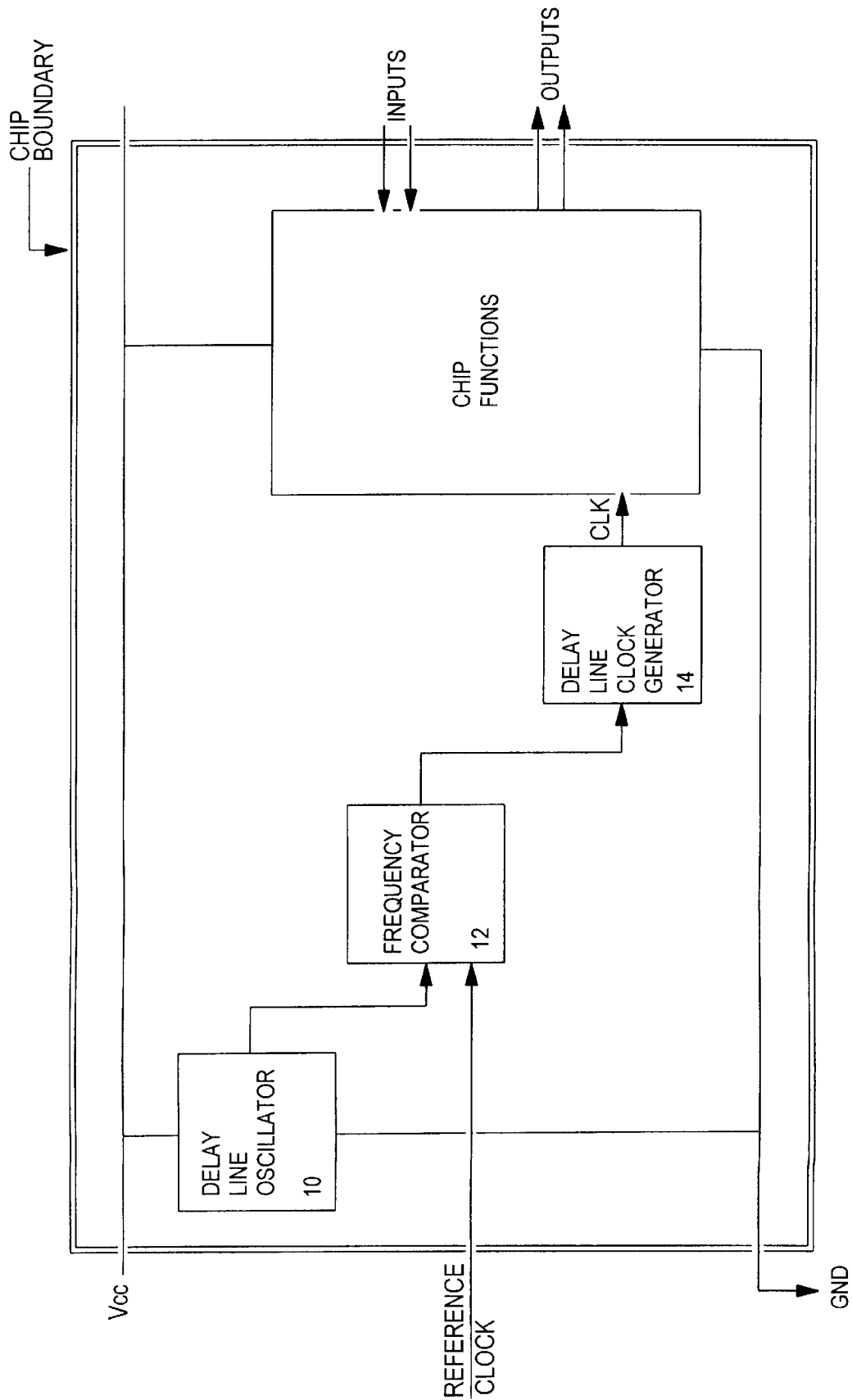
FIG. 1 is a block diagram of a clock generating system utilizing a delay line clock generator.

FIG. 1 shows a functional block diagram of a clock generating system in accordance with the invention. The delay line oscillator 10 generates a clock signal which is output to frequency comparator 12. The frequency comparator 12 also receives an input from an external reference clock which is located off the chip. The external reference clock (not shown) outputs a stable clock signal having a known frequency. The frequency comparator 12 compares the frequency of the reference clock to the frequency of the delay line oscillator 10 and outputs a signal to the delay line clock generator 14. The delay line clock generator 14 uses the information from the frequency comparator 12 to generate an on-chip clock. The on-chip clock signal provides the timing for the logic functions of the chip based on the current chip conditions. Details of the delay line oscillator 10 are shown in FIG. 2.

Figure 2:
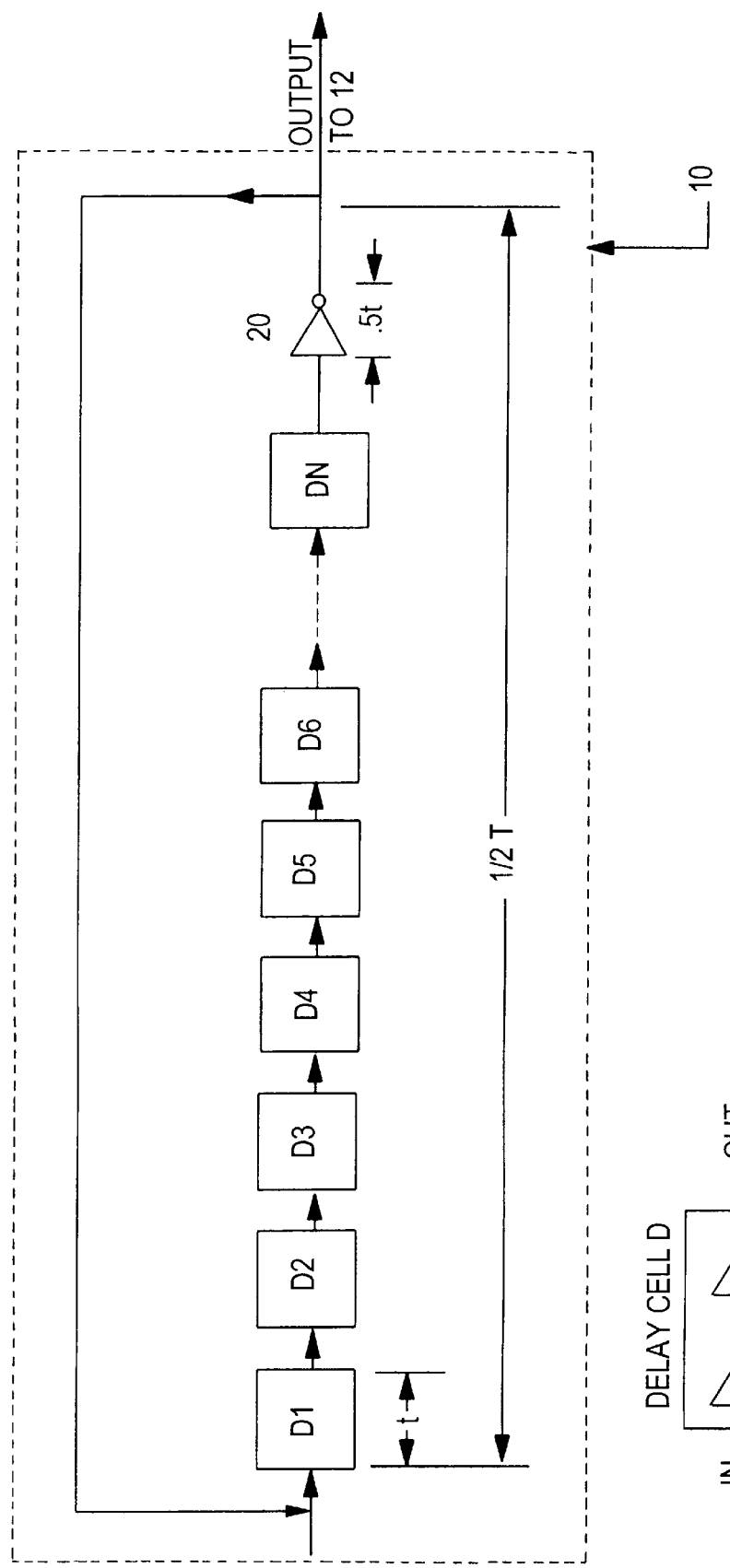
FIG. 2 is a detailed block diagram of the delay line oscillator of FIG. 1.

With reference to FIG. 2, the delay line oscillator 10 is made up of a cascaded array of N delay cells, D1-DN. Each of the individual delay cells D comprises a pair of serially connected inverters. As CMOS and other processing technologies provide greater density of devices on chips, long strings of cascaded inverters can be obtained at lower and lower cost and the inverters can be used as the basic high resolution unit delay element. However, other logic elements may also be used as the basic delay element without departing from the concept of the invention. Examples of cascaded inverters used as high resolution delay elements are in U.S. Pat. Nos. 5,451,894 and 5,457,719, both assigned to the assignee of the present invention.

A signal which propagates through each delay cell D in the delay line oscillator 10 has a nominal propagation delay time t, when operating under standard operating conditions. The value of t is known for these standard operating conditions. Using this known propagation delay time t, a system designer builds the delay line oscillator 10 by cascading N delay cells together to generate a clock signal with a known period.

For example, assume that the reference clock has a period of T, the period of the delay line oscillator 10 is also T in order to generate a signal having the same nominal frequency as the reference clock. The number of delay cells cascaded along with inverter 20 yields a delay time of (½)T. From FIG. 2, a "high" signal input to the delay line oscillator 10 propagates down the delay line until the signal reaches the end of the delay line at delay cell DN. At this point, the "high" signal propagates through inverter 20 and the delay line oscillator 10 output switches to "low". This "low" signal is fed back to the beginning of the delay line. The output signal of the delay line oscillator 20 remains "low" until the signal propagates to the end of the delay line where it switches back to "high". This process repeats and alternates the output between "high" and "low". The output signal period is equal to (2)[(Nt)+(½)t] or 2Nt+t, where N is the number of cascaded delay cells and t is the delay period for each delay cell under normal operating conditions.

The delay cells in the delay line oscillator 10 may be assigned addresses, as described in U.S. Pat. No. 5,457,719, assigned to the assignee of the present invention and incorporated herein by reference. This use of addressing enables the frequency comparator 12 to quickly know the length of the delay line and facilitates changes to the length of the delay line.

As discussed earlier, as the environmental conditions of the chip change, the propagation delay time of the delay cells changes. In order to determine the actual propagation delay of the delay cells based on the current environmental conditions on the chip, the frequency comparator 12 compares the output of the delay line oscillator 10 to the external reference clock.

The reference clock is located off the chip and normally is a stable crystal reference clock. However, the reference clock can be any type of clocking device which outputs a stable, accurate clock signal.

The frequency comparator 12 counts the number of cycles of the reference clock and the delay line oscillator 10 in a given period of time. The frequency comparator 12 compares the number of cycles of the two clock sources. Using this information, the frequency comparator 12 determines whether the delay line oscillator 10 is operating above or below the frequency of the reference clock.

When chip temperature increases, the propagation delay time of the inverters is expected to increase, slowing the rate of operation of the inverters and therefore slowing the rate of the delay line oscillator 10. The comparator determines the actual frequency of the delay line oscillator 10 for the current chip conditions. With the actual frequency of the delay line oscillator 10 known, the frequency comparator 12 determines the actual propagation delay time t, of each delay cell through simple calculations, T=(2N+1)t, where T is equal to the actual period of the delay line oscillator 10 and N is equal to the number of delay cells cascaded in the delay line oscillator 10.

The frequency comparator 12 can be any one of many conventional comparator devices which are known in the art. The frequency comparator 12 can be a simple device which counts the number of cycles occurring in a reference period. Alternatively, the comparator can include logic which allows it to output a signal to control the delay line clock generator 14 as described with reference to FIG. 4. However, any one of the known frequency comparators is suitable for use in the present invention.

Figure 3:
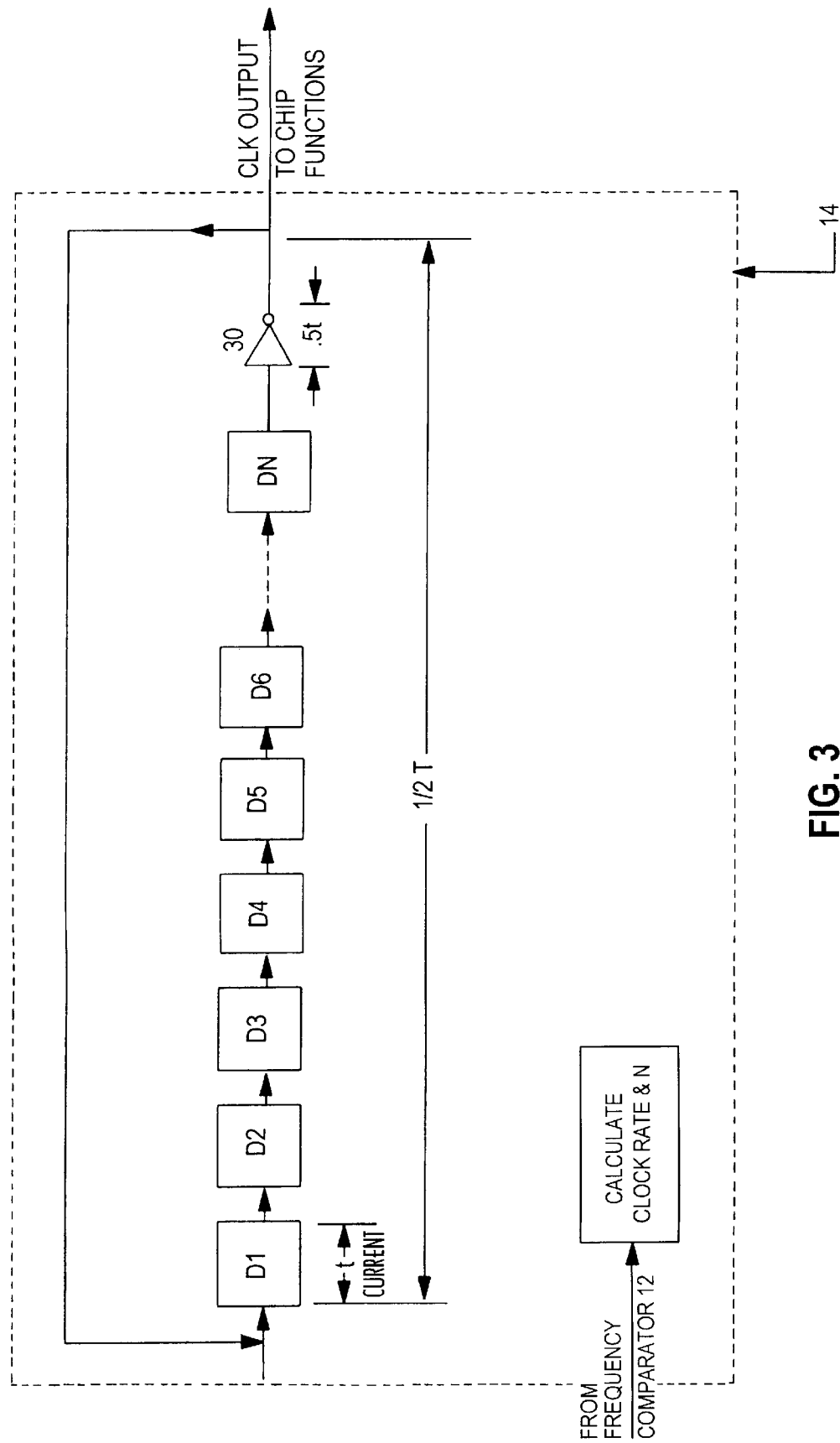
FIG. 3 is a detailed block diagram of the delay line clock generator of FIG. 1.

With reference to FIG. 3, the delay line clock generator 14 receives the frequency comparator 12 output. The delay line clock generator 14 uses this information to determine by what percentage the operation of the inverters has either slowed down or sped up from the nominal propagation time under standard operating conditions. This information determines how to set the frequency of the delay line clock generator 14.

For example, assume that the propagation delay time of a signal through a pair of cascaded inverters is 100 picoseconds under standard operating conditions. If the frequency comparator 12 determines that the propagation delay through the pair of inverters has slowed to 150 picoseconds, this is a 50% increase in the time needed to pass a signal through the inverters. Correspondingly, the other logic elements on the same silicon substrate will exhibit these same delays. Therefore, the clock rate should correspondingly decrease from the maximum value by 50% and this value is the new clock frequency for the current conditions on the chip. The system designer chooses the maximum clock frequency for optimum chip performance and designs the chip according to this frequency. This maximum clock frequency is known by the delay line clock generator 14.

The delay line clock generator 14 is built the same way that the delay line oscillator 10 is built. The delay line clock generator 14 calculates the number of cascaded delay cells to connect in order to generate a clock signal which has a period T based on the new clock frequency. The length of the delay line along with inverter 30 totals a delay time of (½)T. The delay line clock generator 14 uses the actual propagation delay time of each delay cell determined from the frequency comparator 12 under the current conditions and does not use the nominal time used in the delay line oscillator 10.

The delay line clock generator 14 outputs a clock signal for use on the chip that is properly calibrated for optimum chip performance based on the current chip conditions. The delay line clock generator 14 does not suffer from the fact that the inverter elements may have slowed down (or sped up) because the actual delay time of the inverter elements is known from the comparator output and hence the new optimum chip frequency is known.

The system in FIG. 3 facilitates an on-going, real time adjustment of the chip clock frequency based on the current conditions. Since the chip conditions will change with time, corresponding changes to the delay line clock generator 14 are necessary. The system designer chooses a period of time in which to perform the frequency comparison between the delay line oscillator 10 and the reference clock. Each time the frequency comparison is made, the frequency comparator 12 determines the actual delay time of the logic elements on the chip. The delay line clock generator 14 uses this information and generates a new clock signal which compensates for any variation in chip operating conditions. In this manner, as the chip conditions change, the chip logic functions continue to perform at the maximum clock rate for the current conditions.

Figure 4:
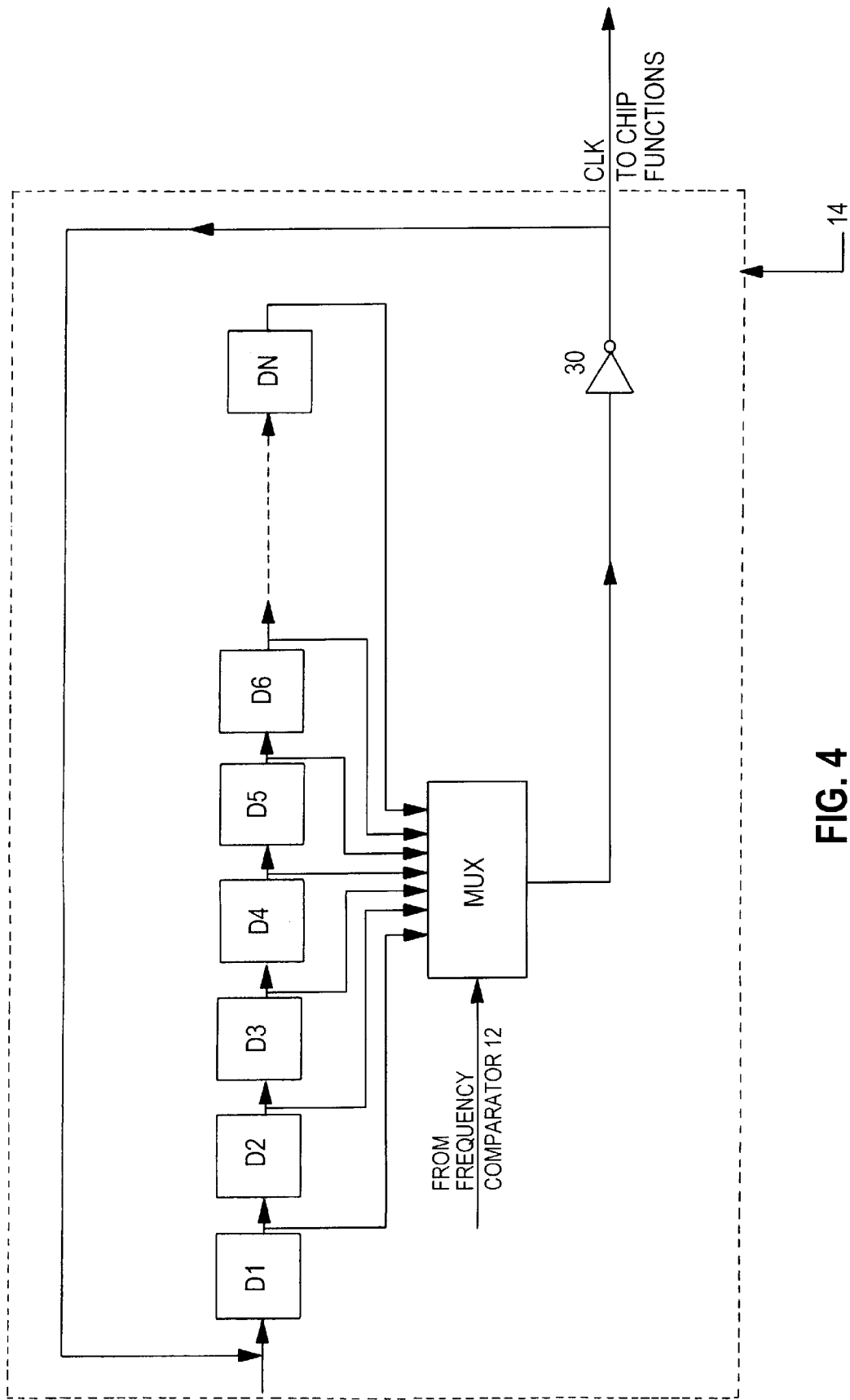
FIG. 4 is a detailed block diagram of an alternative delay line clock generator of FIG. 1.

There are many ways in which to build the delay line clock generator. With reference to FIG. 4, an array of the delay cells may be connected to a multiplexer. The inputs to the multiplexer are the output Laps from the delay line. In this manner, the length of the delay line is chosen by a control input to the multiplexer.

The control input determines which output tap is looped back to the input of the delay line and effectively controls the length of the delay line. This control input can come directly from the frequency comparator 12 which determines the actual delay value of the delay cells. Alternatively, this input can be controlled by calculations performed by the delay line clock generator 14. As discussed earlier, the delay cells in the delay line may be assigned addresses. This use of addressing facilitates changes to the length of the delay line and also calculations made by the frequency comparator 12 and the delay line clock generator 14.

Described has been a system and method for generating a clock signal for use on a chip which employs only standard logic cells that can be readily integrated with the digital functions on the chip. An advantage of the invention is that the chip functions at the optimum frequency even though the environmental conditions change. Another advantage of the invention is that the delay line clock generator is less susceptible to noise due to the all digital design.

In this disclosure, there is shown and described only the preferred embodiments of the invention, but, as aforementioned, it to be understood that the invention is capable of use in various other combinations and environments and is capable of changes or modifications within the scope of the inventive concept as expressed herein.

What is claimed is:

1. A clock generating system comprising:
   an oscillator located on a chip, for generating a signal having a nominal frequency;
   a reference clock located off the chip having said nominal frequency;
   a comparator, having a first input coupled to the oscillator and a second input coupled to the reference clock, for comparing the frequency of the oscillator to the frequency of the reference clock and providing an output signal indicating the difference therebetween; and
   a clock generator coupled to the comparator and having an input for receiving the output signal from the comparator, wherein the clock generator includes:
      a plurality of serially connected delay cells having respective output taps; and
      a multiplexer having inputs coupled to the output taps of the serially connected delay cells and being responsive to the output signal from the comparator for generating a clock signal for use on the chip.

2. The clock generating system of claim 1, wherein each delay cell comprises a pair of serially connected inverters.

3. The clock generating system of claim 1, wherein the oscillator comprises N serially connected delay cells and N is based upon the period of the nominal frequency signal.

4. The clock generating system of claim 1, wherein the oscillator comprises N serially connected delay cells and N is based upon the propagation delay time of each delay cell.

5. The clock generating system of claim 1, wherein the oscillator comprises N serially connected delay cells, wherein the delay cells are configured such that the propagation time of a signal through the N delay cells corresponds in value to ½ the period of the nominal frequency signal.

6. The clock generating system of claim 1, wherein the clock generator comprises M serially connected delay cells, wherein M corresponds in value to a characteristic of the comparator output signal.

7. A method of generating a clock signal which compensates for chip operating conditions, comprising the following steps:
   a) generating a first on-chip clock signal having a nominal frequency;
   b) comparing the frequency of the first on-chip clock signal to the frequency of a reference clock having said nominal frequency;
   c) outputting the difference between the on-chip clock signal and the reference clock; and
   d) generating a second on-chip clock signal based on the result of step c) by: passing a signal through M serially connected delay cells; and
   selecting an output of one the M serially connected delay cells based on the difference between the on-chip clock signal and the reference clock to generate the second on-chip clock signal.

8. The method of claim 7, wherein step a) further comprises:
   passing an input signal through N serially connected delay cells.

9. A clock generating system comprising:
   an oscillator located on a chip and configured for generating a signal having a nominal frequency;
   a reference clock located off the chip and configured for generating a reference clock signal having said nominal frequency;
   a comparator coupled to receive the oscillator signal and the reference clock signal and providing an output signal indicating a frequency difference therebetween; and
   a clock generator coupled to the comparator and configured for responsively generating a clock signal for timing on the chip, wherein the clock generator includes:
      a plurality of serially connected delay cells having respective output taps; and
      a multiplexer having inputs coupled to the output taps of the serially connected delay cells and being, responsive to the output signal from the comparator for generating the clock signal for timing on the chip.

10. A clock generating system comprising:
    a delay line contained on a chip, comprising N serially connected delay cells for generating a first clock signal having a nominal frequency, wherein each delay cell comprises a pair of serially connected inverters;
    a reference clock located off the chip having said nominal frequency;
    a comparator, having a first input coupled to an output of the delay line and a second input coupled to the reference clock, for comparing the frequency of the first clock signal to the frequency of the reference clock and operative for providing an output indicating the difference therebetween; and
    a clock generator for generating a second clock signal for use on the chip, the clock generator coupled to the comparator, wherein the clock generator includes:
       M serially connected delay cells having respective output taps, wherein each delay cell comprises a pair of serially connected inverters and M corresponds in value to a characteristic of the comparator output; and
       a multiplexer having inputs coupled to the output taps of the M serially connected delay cells and being responsive to the output from the comparator for generating the second clock signal for use on the chip.

11. The clock generating system of claim 10, wherein the N delay cells are configured such that the propagation time of a signal through the N delay cells corresponds in value to approximately ½ the period of the first clock signal.

* * * * *